Sept. 16, 1969 G. H. TAYLOR, JR 3,466,732
METHOD OF SERVICING PRINTED CIRCUIT BOARDS
Filed Nov. 18, 1966
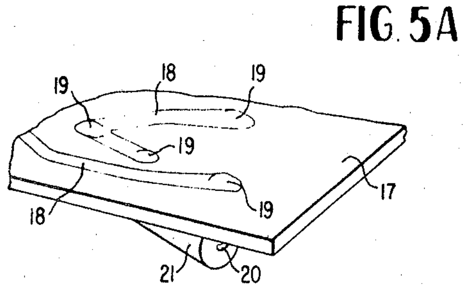
FIG. 5A
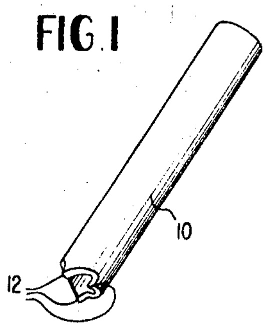
FIG. 1
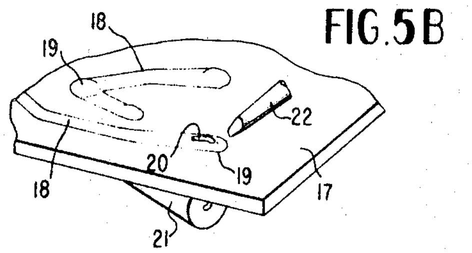
FIG. 5B
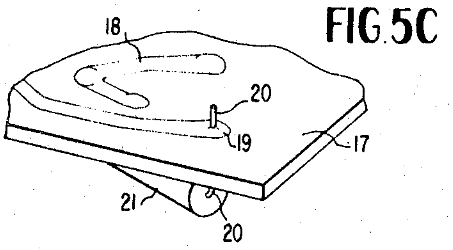
FIG. 5C
FIG. 2
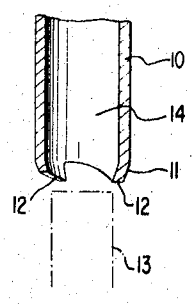
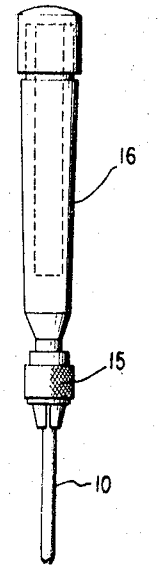
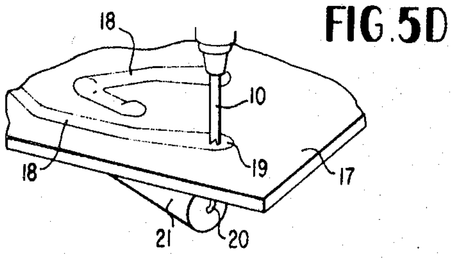
FIG. 5D
FIG. 3
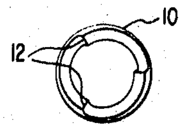
FIG. 4
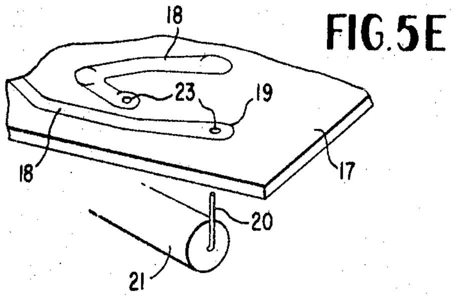
FIG. 5E
INVENTOR
GEORGE H. TAYLOR, JR.
BY B. P. Fishburne, Jr.
ATTORNEY United States Patent Office 3,466,732
Patented Sept. 16, 1969

3,466,732

METHOD OF SERVICING PRINTED CIRCUIT BOARDS

George H. Taylor, Jr., P.O. Box 404,
Hendersonville, N.C. 28739

Filed Nov. 18, 1966, Ser. No. 595,473
Int. Cl. B23p *19/04, 7/00*
U.S. Cl. 29—426 1 Claim

ABSTRACT OF THE DISCLOSURE

Electrical components are clearly separated from printed circuit boards by removing excess conducting material at terminals of components to expose lead wire ends. The lead wire ends are bent up perpendicular to the board and a tubular cutter placed over each lead wire end, cuts through the board to complete the separation.

This invention relates to a method of and apparatus for repairing or servicing printed circuit boards and the like.

More particularly, the invention method and apparatus facilitates the clean removal and/or replacement of the numerous small electrical components whose lead wires extend through openings in the board and are soldered to terminals of the printed circuitry on the other side of the board.

The above type of repair work or maintenance work on printed circuits has been extremely difficult or totally impractical because no ready means has been available to effect the clean separation of the individual electrical components from the board without damaging the board and/or the component and without excessively obliterating the printed circuit lines. The use of a soldering iron for removing components is not effective and the use of scraping, prying and gouging type implements generally results in serious and permanent damage to parts and to the board.

In accordance with this invention, there is provided a highly simplified and economical method and apparatus for quickly and cleanly removing individual circuit components from a printed circuit board or panel without disturbing or damaging adjacent components and without damaging the board itself or the printed circuit lines thereon. Consequently, by virtue of the invention, the repair and maintenance of numerous printed circuit boards is rendered practical for the first time resulting in a substantial economy and discontinuance of the practice of discarding boards which are perfectly useful after a minor change or alteration.

Other objects and advantages of the invention will become apparent during the course of the following detailed description.

In the accompanying drawings forming a part of this application and in which like numerals are employed to designate like parts throughout the same, FIGURE 1 is an enlarged perspective view of a tubular cutter or drill employed in the method;

FIGURE 2 is an enlarged fragmentary longitudinal cross section of the cutter and partially illustrating its use;

FIGURE 3 is an end elevation of the cutter;

FIGURE 4 is a side elevational view of the cutter within a chuck or holding device; and FIGURES 5*a* through 5*e* are fragmentary perspective views of a printed circuit board illustrating the several steps of the method.

In the drawings, there is illustrated a preferred embodiment of the invention and attention is directed first to FIGURES 1 through 4 which show the apparatus or implement employed in the practice of the method. As shown, the implement comprises a tubular cutter or drill 10 of tempered steel or the like having a small uniform cylindrical bore and a smooth cylindrical outer surface. The forward cutting end of the implement 10 is preferably tapered conically as at 11 to render the same self-centering during use. The implement or cutter preferably has three circumferentially equidistantly spaced sharp cutting teeth 12 formed thereon and these teeth are preferably formed so as to toe inwardly somewhat. This particular arrangement has been found to avoid twisting of the lead wire of the particular component being removed from the circuit board. In FIGURE 2, a component lead wire 13 is shown in broken lines on a greatly enlarged scale. In use, the tubular cutter 10 receives the lead wire within its bore 14 while the cutting teeth 12 cut through the board closely surrounding the lead wire with a clean cut, causing only a slight enlargement of the original opening in the board having the lead wire therein.

As shown in FIGURE 4, the cutter 10 may be secured to a chuck 15 equipped with a convenient handle 16. If preferred, the cutter may be mounted in the chuck of a small electric hand drill.

FIGURES 5*a* through 5*e* illustrate the use of the cutter 10 in the practice of the method and also show certain other preliminary method steps. In these figures, the numeral 17 designates a fragmentary corner portion of a conventional printed circuit board having metallic lines of circuitry 18 on one face thereof applied thereto by known methods. The various printed lines of circuitry on the board 17 have numerous terminal points 19 where the printed lines are electrically connected to the lead wires 20 of electrical components 21 mounted on the opposite face of the board. These components may be various items, such as resistors, capacitors, inductances and the like. The terminal points 19 usually constitute enlargements of solder or like metallic material. During manufacturing, the board 17 is provided with numerous small openings extending therethrough in properly spaced relation to receive the various lead wires 20 so that the same are in proper alignment with the terminal points 19. This is all well known and the invention is concerned solely with the servicing and repair of the assembly, specifically the removal or replacement of individual electrical components 21 in a quick, clean and efficient manner and without damaging the remainder of the board or adjacent components, therefore rendering such repair work practical.

FIGURE 5*a* shows the condition of the board prior to the first method step. The component 21 is mounted and has its lead wires 20 extending through openings of the board, not shown, and directly connected electrically with two of the terminal points 19.

FIGURE 5*b* shows the first step of the method where a soldering iron 22 is employed to remove excess solder at the selected point 19. A wire brush may also be employed if desired. This operation will expose the adjacent bent-over lead wire 20 of the particular component 21.

As shown in FIGURE 5*c*, the exposed lead wire 20 is now straightened up perpendicular to the board in any preferred manner by the use of a convenient blade or with the tubular implement 10.

When this has been done, as depicted in FIGURE 5*d*, the tubular cutter 10 is telescoped over the lead wire 20 and then turned upon its longitudinal axis, either manually or by operation of an electric drill. Sufficient axial pressure is applied to cause the cutter to cut cleanly through the solder and the board immediately surrounding the lead wire 20, having the effect of enlarging the opening holding the lead wire so that the same is cleanly separated from the board without damaging the board or the component or adjacent components. When the other lead wire 20 of the particular component 21 is similarly processed, the component 21 will be cleanly separated from the printed circuit panel as depicted in FIGURE 5*e*.

Following these method steps, a new or replacement electrical component may be quickly applied to the circuit board by simply engaging its lead wires through the remaining openings 23 formed in the work by the use of the cutter 10. The lead wires of the replacement unit may be bent down as in FIGURE 5*b* and soldered. In the above manner, repairs and changes in the printed circuit boards may be accomplished rapidly and economically and with the elimination of much waste.

The advantages of the invention should be readily apparent to anyone skilled in the art and it is therefore thought that no further description is required.

It is to be understood that the form of the invention herewith shown and described is to be taken as a preferred example of the same, and that various changes in the shape, size and arrangement of parts may be resorted to, without departing from the spirit of the invention or scope of the subjoined claims.

I claim:

1. A method of servicing a printed circuit board having conducting circuit lines printed on one side thereof, said circuit lines having terminals, and individual electrical components on the opposite side of the board, each component including lead wires, said board having openings formed therethrough adjacent said terminals receiving said lead wires so that the latter are electrically connected with said terminals, said method comprising the steps of first removing excess conducting material from the terminals of the conducting circuit lines to expose the ends of the lead wires therein, straightening the ends of the lead wires mechanically and causing them to project generally perpendicular to the printed circuit side of the board and above said terminals, employing a thin walled tubular cutter having leading end cutting teeth toed radially inwardly of the tubular cutter to cut through the board immediately around each lead wire and close to the lead wire to completely disconnect the lead wire from the board without twisting the lead wire and thereby only slightly enlarging the opening in the board receiving the lead wire and then removing the components bodily from the board preparatory to placing new or different components on the board including lead wires entering the enlarged openings.

References Cited

UNITED STATES PATENTS

| | | | |
|---|---|---|---|
| 2,897,585 | 8/1959 | Bodewein | 29—426 X |
| 3,180,018 | 4/1965 | Hougen | 29—401 |
| 3,376,630 | 4/1968 | Lempka | 29—401 |

OTHER REFERENCES

Swiggett, Robert, Introduction to Printed Circuits. John F. Rider Publisher, Inc. Received in United States Patent Office Scientific Library, Sept. 14, 1959 (TK7870 S85–C. 4) (pp. 93–96 relied on) (copy in group 323).

CHARLIE T. MOON, Primary Examiner

U.S. Cl. X.R.

29—68.5, 401, 626; 174—68.5